United States Patent [19]

Nakagawa et al.

[11] Patent Number: 4,996,106

[45] Date of Patent: Feb. 26, 1991

[54] PELLICLE

[75] Inventors: Hiroaki Nakagawa, Iwakuni; Hitomi Matsuzaki, Yamaguchi, both of Japan

[73] Assignee: Mitsui Petrochemical Industries, Ltd., Tokyo, Japan

[21] Appl. No.: 267,380

[22] Filed: Nov. 4, 1988

[30] Foreign Application Priority Data

Nov. 5, 1987 [JP] Japan .................................. 62-279627

[51] Int. Cl.$^5$ .......................... B32B 7/12; B32B 27/32
[52] U.S. Cl. .................................... 428/343; 428/422; 428/509
[58] Field of Search ................ 206/334; 428/422, 343, 428/509; 430/5

[56] References Cited

U.S. PATENT DOCUMENTS

| 4,470,508 | 9/1984 | Yen | 206/234 |
| 4,833,051 | 5/1989 | Imamura | 430/5 |

FOREIGN PATENT DOCUMENTS

| 0252574 | 1/1988 | European Pat. Off. |   |
| 0304211 | 2/1989 | European Pat. Off. |   |
| 60-57841 | 4/1985 | Japan | 206/334 |
| 60-237450 | 11/1985 | Japan | 206/334 |

OTHER PUBLICATIONS

D. W. Fisher et al., IBM Technical Disclosure Bulletin, vol. 20, No. 8, pp. 3000, Jan. 1978.

Patent Abstracts of Japan, (Japanese Published Patent Appln. No. 61-241756) vol. 11, No. 91 (P-558) [2538] Mar. 23, 1987.

Primary Examiner—Thomas J. Herbert
Attorney, Agent, or Firm—Sherman and Shalloway

[57] ABSTRACT

A pellicle is compose of a pellicle frame, a pellicle film spread on one side face of the pellicle frame, and a tacky substance layer having a high light transmittance formed on the inner side face of the pellicle film.

2 Claims, 1 Drawing Sheet

PELLICLE

BACKGROUND OF THE INVENTION

1. Field of the Invention

The present invention relates to a pellicle used as the dust-proof cover during exposure of a photomask or a reticle.

2. Description of the Related Art

At the lithographing step, a mask comprising a glass sheet and a circuit pattern of a vacuum deposition film of chromium or the like (hereinafter called mask) formed on the surface of the glass sheet is used, and the circuit pattern is transferred to a resist-coated silicon wafer. At this step, if light exposure is carried out when a foreign substance such as dust is adhered to the circuit pattern on the mask, the foreign substance is transferred to the wafer and a defective product is formed. Especially, when light exposure is carried out by using a stepper, the risk that all of the chips formed on a wafer will be defective is increased, and an adhesion of foreign matter to a circuit pattern of a mask or the like becomes a serious problem. Therefore, a pellicle has recently been developed and used by which this problem is eliminated.

In general, the pellicle comprises a transparent film of nitrocellulose or the like spread on one side face of a pellicle frame made of aluminum, a double-adhesive tape is applied to the other side face of the pellicle, and the pellicle is attached to a mask. When this pellicle is used, the intrusion of a foreign substance from the outside can be prevented, and even if a foreign substance adheres to the film, the foreign substance is transferred in the fuzzy state during light exposure and no particular problem arises. Nevertheless, the foreign substance already attached on the innerside of the film or the pellicle frame can no longer be removed, and when such a pellicle is used, to prevent interference with the exposure because foreign matter attached to the innerside of the pellicle has fallen onto the photomask or the reticle, a pellicle provided with a tacky film on the inner side face of the pellicle frame has been proposed (see: Japanese Unexamined Pat. Publication (Kokai) No. 60-57841).

On the other hand, a single layer thin film of nitrocellulose has been primarily utilized as the pellicle film, and to improve the stability of the light transmittance and the like during the exposure step, a pellicle film having a reflection preventive layer comprising a fluorine type polymer or a silicon type polymer and the like on a transparent film of nitrocellulose has been proposed (see: Japanese Unexamined Pat. Publication (Kokai) No. 60-237450).

Nevertheless, in the pellicle described above (see: Japanese Unexamined Pat. Publication (Kokai) No. 60-57841), since a double-adhesive tape is used at the adhered face between the pellicle frame and the mask, a foreign substance such as dust is generated from the foamed tape which is the substrate for the double-adhesive tape, and becomes a source of contamination.

Accordingly, Japanese Pat. application No. 62-205533 proposed a pellicle which does not use a double-adhesive tape at the adhered surface. But, even in this method, the foreign matter attached on the inner face of the pellicle film may be sometimes caused to fall onto the mask due to shock during usage, to thereby cause the production of defective LSI's.

On the other hand, the pellicle film used as a dust-proof film must have a high light ray transmittance, and accordingly, the presence of a foreign substance is extremely disadvantageous, and thus a material to which the attachment of a foreign substance is difficult has been used. When forming a reflection preventive film as disclosed in the above-mentioned Japanese Unexamined Pat. Publication (Kokai) No. 60-237450, however, a material without tackiness on the surface must be used to prevent the attachment of a foreign substance. Nevertheless, although such a material without tackiness on the surface can form a film on which a foreign substance can be attached only with difficulty, any foreign substance attached thereto will readily drop therefrom, and thus the problem arises that such a foreign substance will interfere with the exposure.

SUMMARY OF THE INVENTION

Accordingly, the objects of the present invention are to eliminate the above-mentioned disadvantages of the prior art and to provide a pellicle which prevents the dropping of a foreign substance onto a photomask or a reticle by attaching the foreign substance to a tacky substance layer having a high light transmittance and formed on the inner face of the pellicle film.

Other objects and advantages of the present invention will be apparent from the following description.

In accordance with the present invention, there is provided a pellicle comprising a pellicle frame, a pellicle film spread on one side face of the pellicle frame, and a tacky substance layer having a high light transmittance formed on the inner side face of the pellicle film.

BRIEF DESCRIPTION OF THE DRAWINGS

The present invention will be better understood from the description set forth below with reference to the accompanying drawing of FIG. 1, which is a sectional view of a part showing the pellicle of the Example, in which 1 is a pellicle, 2 a pellicle frame, 3 a pellicle film, 4, 6, and 7 are tacky substance layers, 5 a non-tacky layer, and 8 a material to be adhered.

DESCRIPTION OF THE PREFERRED EMBODIMENTS

Figure 1:
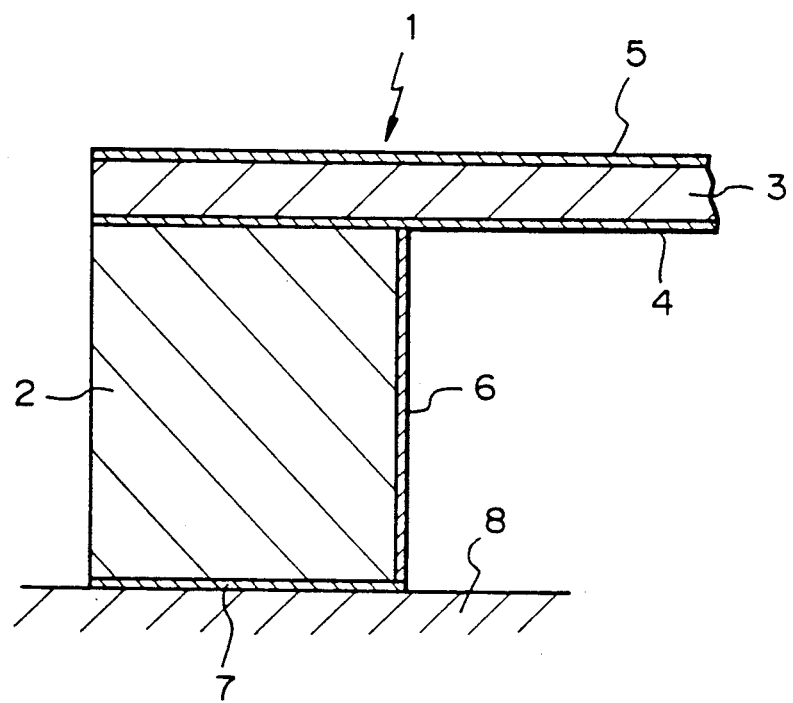

The pellicle frame usable in the present invention is not particularly limited, but an almite-treated aluminum frame used in the prior art may be utilized, and other materials can be used. The shape of the pellicle frame may be as desired, for example, cylindrical, square. Also, preferably a tacky substance layer is formed on the inner side face of the pellicle frame.

In the present invention, the transparent thin film, which becomes the main body of the pellicle film, may be a film having a large average light transmittance at the wavelengths of 350 to 450 nm used for exposure, but preferably is a cellulose derivative thin film such as nitrocellulose, ethylcellulose, propionic acid cellulose, and the like. Among the above, from the aspects of an average light transmittance at 350 to 450 nm and the film strength, nitrocellulose is preferred. Of the nitrocelluloses, those having a nitration degree (N%) of 11 to 12.5%, particularly 11.5 to 12.2%, and an average molecular weight (weight average $\overline{M}w$) of 50,000 to 350,000, particularly, 70,000 to 320,000 are preferred. Here, the term, average light transmittance, refers to an average value of the transmittance at the same number of peak portions and valley portions of interference waves occurring between 350 and 450 nm.

The thickness of the transparent thin film is selected so that transmittance to the desired wavelength between 350 and 450 nm may be higher, but a thickness of 2.85 μm is generally selected to raise the transmittance to around 436 nm +405 nm +365 nm of the exposed wavelength currently in use, and a thickness of 0.865 μm is used for raising the transmittance at 436 nm.

As the tacky substance for forming the tacky substance layer on the inner side face of the transparent thin film which becomes the main body of the pellicle film, there may be employed a substance having a high light transmittance and a tackiness, but preferably the substance used can firmly hold a tacky foreign substance attached thereto. The tacky substance preferably has a refractive index not higher than that of the transparent thin film, without decomposition by the light rays at 350 to 450 nm. Also, the tacky substance may have a reflection preventive effect.

As such tacky substances, for example, there may be included fluorine type polymers and silicone type polymers. As the fluorine type polymer, acrylic fluorine polymers are preferred, for example, polyfluoro(meth)acrylates comprising at least one monomer selected from $CH_2=CHCOOR^1$ or $CH_2=C(CH^3)COOR^2$ wherein $R^1$, $R^2$ are each a fluoroalkyl group which may also contain an ethereal oxygen atom interposed, namely, homopolymers or copolymers of fluorine containing acrylates, homopolymers, copolymers of fluorine containing methacrylates, copolymers of fluorine containing acrylates, and fluorine containing methacrylates, and by suitably varying the kind of the fluoroalkyl group of $R^1$ and $R^2$ and the copolymer composition, a polymer with a desired fluorine content can be used.

Examples of $R^1$ and $R^2$ in the above-mentioned formulae are as follows:

$-CH_2CF_3$, $-CH_2C_2F_5$, $-CH_2C_3F_7$, $-CH_2C_4F_9$,
$-CH_2C_5F_{11}$, $-CH_2C_7F_{15}$, $-CH_2C_8F_{17}$,
$-CH_2C_9F_{19}$,
$-CH_2C_{10}F_{21}$, $-CH_2CH_2CF_3$, $-CH_2CH_2C_2F_5$,
$-CH_2CH_2C_3F_7$, $-CH_2CH_2C_4F_9$,
$-CH_2CH_2C_5F_{11}$,
$-CH_2CH_2C_7F_{15}$, $-CH_2CH_2C_8F_{17}$,
$-CH_2CH_2C_9F_{19}$,
$-CH_2CH_2C_{10}F_{21}$, $-CH_2(CF_2)_2H$, $-CH_2(CF_2)_4H$,
$-CH_2(CF_2)_6H$, $-CH_2(CF_2)_8H$, $-CH_2(CF_2)_{10}H$,
$-CH(CF_3)_2$, $-CF(CF_3)_2$, $-(CH_2)_{50}CF(CF_3)_2$,
$-(CH_2)_{11}OCF(CF_3)_2$, $-CH_2O(CF_2)OCF_3$,
$-CH_2O(CF_2)OC_2F_5$, $-CH_2O(CF_2)_{20}C_3F_7$,
$-CH_2O(CF_2)_{20}C_4F_9$,
$-CH_2CF(CH_3)OCF_2CF(CF_3)OCF_2CF_2CF_3$

In the present invention, preferably a polyfluoro(meth)acrylate having a fluorine content of 50% by weight or more is used.

Among the above, a preferable tacky substance is a polyfluoroacrylate which is a copolymer of trifluoroethyl acrylate and perfluorooctylethyl acrylate. The monomer (A) of this copolymer, trifluoroethyl acrylate is represented by $CH_2CHCOOCH_2CF_3$, and the monomer (B), perfluorooctylethyl acrylate by $CH_2=CHCOOC_2H_4C_8F_{17}$.

The above polyfluoro(meth)acrylate also has a reflection preventive property. The tacky substance layer is formed on the inner side face of the transparent thin film of the cellulose derivative, with the above tacky substance, and the film thickness at that time is preferably ¼ n (n is the refractive index) of the wavelength of the target light.

A layer such as a reflection preventive layer or the like can be formed on the outer side face of the transparent thin film which becomes the main body of the pellicle film, as in the prior art. In this case, the layer such as reflection preventive layer or the like to be formed on the outer side face is preferably a non-tacky substance layer. As the non-tacky substance layer, a non-tacky fluorine type polymer or silicone type polymer used in the prior art as a reflection preventive layer may be utilized. As the fluorine type polymer mentioned above, there may be included copolymers of tetrafluoroethylene and vinylidene chloride, or vinylidene fluoride, ternary copolymers of tetrafluoroethylene, vinylidene chloride, or vinylidene fluoride, and hexafluoropropylene and the like.

The layers formed on the inner side face and the outer side face of the transparent thin film may be either a single layer or multiple layers. In the case of multiple layers, a tacky substance layer can be used for the innermost layer and a non-tacky substance layer for the outermost layer.

The method for preparing the pellicle film having a tacky substance layer may be practiced as follows, in the case of forming a tacky substance layer comprising a polyfluoroacrylate on a cellulose derivative transparent thin film.

First, a cellulose derivative solution is fed onto a smooth substrate such as glass, and a transparent film of the cellulose derivative is formed by the rotatory film fabrication method. The cellulose derivative is dissolved in a good solvent and the solution is purified by, for example, filtration, before use if necessary. As the solvent, there may be employed ketones such as methyl ethyl ketone, methyl isobutyl ketone, acetone and the like; lower fatty acid esters such as butyl acetate, isobutyl acetate and the like; and mixtures of these solvents with alcohols such as isopropyl alcohol and the like. The thickness of the transparent thin film formed can be suitably varied by changing the solution viscosity or the rotational speed of the substrate.

The cellulose derivative transparent thin film formed on the substrate is dried by, for example, hot air or IR-ray lamp irradiation, to remove the residual solvent.

Subsequently, a solution of a tacky substance such as the above polyfluoroacrylate is applied over the dried cellulose derivative thin film, and a tacky substance layer comprising a fluorine polymer is formed by the rotatory film fabrication method, as for the cellulose derivative thin film. In this case, the solvent for dissolving polyfluoroacrylate is selected from among m-xylenehexafluoride

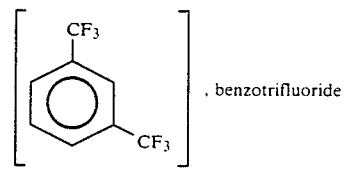, benzotrifluoride

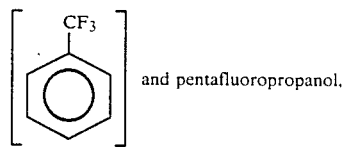 and pentafluoropropanol.

and among these, m-xylenehexafluoride is particularly preferred. The use of such specific solvents enables a polyfluoroacrylate solution with a good rotatory film fabricability to be obtained, and further, adverse influences which dissolve or swell the cellulose derivative thin film, which becomes the base layer, can be prevented during the formation of the polyfluoroacrylate reflection preventive film.

The thickness of the tacky substance layer can be controlled by suitably varying the solution viscosity and the rotational speed of the substrate, etc., as in the case of the cellulose derivative thin film.

On the other hand, when a pellicle film has a tacky substance layer on one face and a non-tacky substance layer on the other face, the transparent thin film having the tacky substance layer on one face is peeled from the substrate, plastered on a tentative frame, and on the other face not having the tacky substance layer, is formed a solution of, for example, a tetrafluoroethylene/vinylidene chloride or vinylidene fluoride/hexafluoropropylene ternary copolymer (50/29/21 weight ratio) dissolved in a solvent such as perfluoro-2-methyl-1-oxy-3-thiacyclohexane-3, 3-dioxide whereby a reflection preventive layer comprising a non-tacky substance layer can be formed.

As the method for continuously preparing a pellicle film having a tacky substance layer and a non-tacky substance layer, a polyfluoroacrylate solution (note, the solvent is not limited to the solvents mentioned above and any solvent which will dissolve the same polymer can be used) is fed onto a smooth substrate such as glass, etc., a polyfluoroacrylate thin film is formed by the rotatory film fabrication method, and the film is dried by, for example, hot air or IR-ray lamp irradiation, to remove the residual solvent. Then, after a transparent thin film of a cellulose derivative is formed on the thin film by performing the operation as described above, a solution of tetrafluoroethylene/vinylidene chloride or vinylidene fluoride/hexafluoropropylene ternary copolymer is applied to form a non-tacky substance layer, whereby a three-layer structure pellicle film can be formed.

The pellicle film having the tacky substance layer thus formed on the substrate is peeled from the substrate and used as the pellicle. In this case, for example, a cellophane tape or a frame-shaped implement having an adhesive coated thereon is pushed against the outermost layer of the laminated film formed on the substrate. Namely, the polyfluoroacrylate film is in contact with the outer atmosphere to be adhered thereon, and the film can be directly peeled from the substrate by lifting the cellophane tape or the frame-shaped implement, from one end, by hand or by a mechanical means. In this case, since the interlayer adhesive force between the cellulose derivative layer and the polyfluoroacrylate layer is great, the film can be peeled without separation and the pellicle film thus obtained plastered onto a pellicle frame to form a pellicle.

The pellicle thus prepared is used as dust-proof cover during exposure, by being superposed on a photomask or a reticle as in the prior art. During the preparation of the pellicle, care is taken that no foreign substance such as dust, etc., is adhered thereto, but any foreign substance accidentally brought in is adhered to the tacky substance layer and will not fall onto the photomask. The foreign substance attached on the outer side face of the pellicle can be removed by air blowing, but the foreign substance attached on the inner side face will not fall onto a photomask or reticle, and thus will not cause defective LSI's, because substances having a size of about 50 $\mu$m or less will not form images on the transfer face.

EXAMPLES

The present invention will now be further illustrated by, but is by no means limited to, the following Examples, with reference to the drawing.

FIG. 1 is a sectional view of a part showing the pellicle of the Example. In the drawing, 1 is a pellicle having a pellicle film 3 spread on one side face of a pellicle frame 2. On the inner side face of the pellicle film 3 is formed a tacky substance layer 4, and a non-tacky substance layer 5 is formed on the outer side face. This layer 5 is also utilized as the reflection preventive layer. Also, on the inner side face and the lower side face of a pellicle frame 2 are formed tacky substance layers 6 and 7, and the tacky substance layer 7 is used for adhesion with the material 8 to be adhered, such as a photomask or reticle.

The pellicle 1 having the above constitution is used as the dust-proof cover during exposure, while adhered to the material 8 to be adhered by utilizing the tacky substance layer 7. At this time, the foreign substance attached to the non-tacky substance layer 5 is removed by air blowing, but the foreign substances attached to the tacky substance layers 6 and 7, will not fall and will not interfere with the exposure.

Example and Comparative Example

Nitrocellulose was dissolved in methyl isobutyl ketone to form a 6% by weight solution. Also, a copolymer of trifluoroethyl acrylate and perfluorooctylethyl acrylate (trifluoroethyl acrylate 67 mol%, perfluorooctylethyl acrylate 33 mol%, fluorine content 52.8% by weight) was dissolved in m-xylenehexafluoride to form a 1.0% by weight solution.

The above fluorine polymer solution was added dropwise by the rotatory coating method and filmed or sheeted by rotation at 500 rpm for 60 seconds to form a tacky substance layer, and then a transparent thin film of nitrocellulose was formed, followed by drying. Further, a solution of a tetrafluoroethylene/vinylidene chloride or vinylidene fluoride/hexafluoropropylene terpolymer (50/29/21 weight ratio) dissolved in perfluoro-2-methyl-1-oxy-3-thiacyclohexane-3, 3-dioxide at a concentration of 0.6% by weight was added dropwise to form a non-tacky substance layer. The pellicle film was peeled from the substrate and spread on a pellicle frame so that the tacky substance was at the inner side face.

On the innerside of the pellicle were attached 12 foreign substances 5 to 10 $\mu$m in size, and the pellicle then plastered onto a quartz substrate and permitted to fall three times from a height of 5 cm. The foreign substances were examined, and as a result, it was found that they were in the same position as before the dropping of the pellicle, and had not fallen onto the quartz substrate.

On the other hand, when the same experiment was conducted using a pellicle of nitrocellulose alone (8 foreign substances attached), three foreign substances were found to have fallen onto the quartz substrate. Also, the positions of the remaining 5 foreign substances on the pellicle were found to be changed.

As described above, according to the present invention, a plasterable-substance layer is formed on the inner side face of the pellicle film, and therefore, it is possible to prevent interference with the exposure by foreign substances attached on the innerside of the pellicle which have fallen onto the material to be adhered, such as a photomask.

We claim:
1. A pellicle comprising:
   (a) a pellicle frame;
   (b) a transparent pellicle film spread on one side face of said pellicle frame, said pellicle film having a refractive index, said pellicle film having an inner side face and an outer side face; and
   (c) a tacky substance layer formed on said inner side face of said pellicle film, said tacky substance layer composed of tacky polyfluoro (meth)acrylate having a fluorine content of 50% by weight or more, having a high light transmittance and having a refractive index not higher than that of said pellicle film.

2. A pellicle as claimed in claim 1, wherein a non-tacky substance layer is formed on said outer side face of said pellicle film.

* * * * *